US012807858B2

(12) United States Patent
He et al.

(10) Patent No.: US 12,807,858 B2
(45) Date of Patent: Nov. 24, 2026

(54) LOW OIL BLEEDING THERMAL GAP PAD MATERIAL

(71) Applicant: Tianjin Laird Technologies Limited, Tianjin (CN)

(72) Inventors: Landi He, Tianjin (CN); Jingqi Zhao, Tianjin (CN)

(73) Assignee: Tianjin Laird Technologies Limited, Tianjin (CN)

( * ) Notice: Subject to any disclaimer, the term of this patent is extended or adjusted under 35 U.S.C. 154(b) by 1015 days.

(21) Appl. No.: 18/080,975

(22) Filed: Dec. 14, 2022

(65) Prior Publication Data

US 2023/0212448 A1 Jul. 6, 2023

(30) Foreign Application Priority Data

Dec. 31, 2021 (CN) ........................ 202111675574.5

(51) Int. Cl.
*C09K 5/14* (2006.01)
*C08G 77/12* (2006.01)
(Continued)

(52) U.S. Cl.
CPC ................ *C09K 5/14* (2013.01); *C08G 77/12* (2013.01); *C08G 77/20* (2013.01); *C08K 7/18* (2013.01);
(Continued)

(58) Field of Classification Search
CPC .......... C09K 5/14; C08G 77/12; C08G 77/20; C08K 7/18; C08K 2201/001;
(Continued)

(56) References Cited

U.S. PATENT DOCUMENTS 5,352,731 A * 10/1994 Nakano .................. C08L 83/04 524/786
11,072,706 B2 7/2021 Shen et al.
(Continued)

FOREIGN PATENT DOCUMENTS

CN 111117260 A 5/2020
CN 111592863 A 8/2020
(Continued)

OTHER PUBLICATIONS

English Translation of WO2018/131486 (Year: 2018).*
(Continued)

*Primary Examiner* — Andrew J. Oyer
(74) *Attorney, Agent, or Firm* — Harness, Dickey & Pierce, P.L.C.; Anthony G. Fussner

(57) ABSTRACT

The present disclosure relates to new types of low oil bleeding thermal interface materials, such as thermal gap pad materials, which may be in the form of a thermally conductive gasket. In exemplary embodiments, a thermal interface material comprises a matrix material and a thermally conductive filler. The thermally conductive filler has particles which are approximately spherical in shape when observed using a scanning electron microscope, an average particle diameter (D50) of 2-120 μm, and an average degree of sphericity of 70-90%. According to the present disclosure, by using a quasi-spherical thermally conductive filler having a specific sphericity, oil bleeding can be prevented, mitigated, or reduced while achieving high thermal conductivity compared to the case of using a perfectly spherical or irregularly shaped thermally conductive filler.

27 Claims, 4 Drawing Sheets

(51) Int. Cl.
*C08G 77/20* (2006.01)
*C08K 7/18* (2006.01)
*H05K 7/20* (2006.01)
*H05K 9/00* (2006.01)

(52) U.S. Cl.
CPC ..... *H05K 7/2039* (2013.01); *C08K 2201/001* (2013.01); *C08K 2201/005* (2013.01); *C08K 2201/006* (2013.01); *H05K 9/0081* (2013.01)

(58) Field of Classification Search
CPC ........ C08K 2201/005; C08K 2201/006; C08K 3/22; C08K 2003/2227; H05K 7/2039; H05K 9/0081; C08L 83/04
See application file for complete search history.

(56) References Cited

U.S. PATENT DOCUMENTS

2020/0283619 A1* 9/2020 Beiermann .............. C08K 3/14
2021/0214233 A1* 7/2021 Sugimoto ............... C08L 83/04
2022/0372359 A1* 11/2022 Iwata ........................ C08K 7/18
2022/0389300 A1* 12/2022 Sugimoto ................ C08K 3/04
2023/0150830 A1 5/2023 Komaki et al.
2024/0309258 A1* 9/2024 Knör ........................ C08L 83/04
2026/0217974 A1* 7/2026 Iwata ........................ C08K 3/22

FOREIGN PATENT DOCUMENTS

CN 111868206 A 10/2020
EP 3668290 A1 * 6/2020 ............ H10W 40/70
JP 201221131 A 2/2012
JP 2016124908 A 7/2016
WO WO-2018131486 A1 7/2018
WO WO-2020261958 A1 12/2020
WO WO-2021200486 A1 10/2021
WO WO-2022059661 A1 3/2022

OTHER PUBLICATIONS

Rejection Decision for Taiwan Application No. 111149006 that claims priority to the instant application; dated Jun. 12, 2024; 12 pages.
European Search Report for EP22213869.5 that claims priority to the same parent application as the instant application; May 26, 2023; 8 pages.
Japanese Office Action for JP2022-209916 that claims priority to the same parent application as the instant application; dated Mar. 12, 2024; 8 pages.

* cited by examiner

LOW OIL BLEEDING THERMAL GAP PAD MATERIAL

CROSS-REFERENCE TO RELATED APPLICATION

This application claims the benefit of and priority to Chinese Patent Application Number 202111675574.5 filed Dec. 31, 2021. The entire disclosure of this Chinese patent application is incorporated herein by reference.

FIELD

The present disclosure relates to thermal interface organic thermally conductive materials, more particularly to a thermal gap pad material with low or no oil bleeding.

BACKGROUND

This section provides background information related to the present disclosure which is not necessarily prior art.

Electrical components, such as semiconductors and transistors, operate optimally at ambient temperature in general. However, the operation of electrical components generates heat which, if not dissipated, could cause the electrical components to operate at a temperature significantly higher than the normal or desired operating temperature. Such an excessively high temperature can adversely affect the operating characteristics of the electrical components and the operation of any equipment associated therewith. To remove the heat, the heat is transferred from the operating electrical component to a heat sink by direct surface contact between the electrical component and the heat sink and/or by contact of an intermediate medium or thermal interface material (TIM) between the electrical component and the heat sink.

For such a thermal interface material, generally a thermal interface material such as thermal silicone grease, a thermally conductive gasket, a phase change material and curable thermal paste is inserted between a heat sink and a heat-generating electronic component, so as to fill the air gap between the heat sink and the electronic component, reduce the interfacial thermal contact resistance and improve the heat dissipativity. Therefore, such thermal interface materials may also be called thermal gap pad materials in various fields.

Thermally conductive gaskets, one of common thermally conductive materials, are more favorable because of more flexible thickness selection range, excellent dimensional stability, as well as material flexibility and compressibility thereof compared to other materials such as thermal silicone grease. Here, silicone resin is often used as the main resin component of thermally conductive gaskets as it maintains a good interfacial wettability with many thermal conductive fillers.

But in a thermally conductive gasket material containing silicone resin, the silicone thermally conductive gasket may “secrete” greasy substances on the surface of a heat sink or an instrument at a temperature above room temperature for an extended period of time or under other harsh conditions such as high temperature, high humidity or cold or thermal shock, which is known as a phenomenon of “oil bleeding”. Because such a thermally conductive material is mostly used in sophisticated and complex electronic and electrical products, the issue of oil bleeding, once occurs, may lead to pollution and cleaning difficulties to an instrument and equipment, and may directly cause visual interference to some products in the field of optical modules; in addition, the bled oil is also likely to cause a short circuit in a device, and the surrounding impurities and particles may be adsorbed or adhered to the bled oil, posing a potential threat to the operation and lifespan of the instrument and equipment.

As such, the problem of oil bleeding is gaining more attention from various electronic manufacturers, and thus the risk of business loss is becoming higher for thermal gap pad material manufacturers. Therefore, it is an urgent and important matter to produce low oil bleeding thermal gap pad materials that meet the function and performance requirements of electronic manufacturers.

CN111592863A proposes a thermal interface material that includes a surface treatment layer along at least one surface of the thermal interface material to suppress the silicone oil bleeding from the thermal interface material along the surface direction of the thermal interface material. But such a thermal interface material having a surface treatment layer does not fundamentally solve the problem of oil bleeding, and has an issue of possibly lowered thermal conductivity.

CN111868206A proposes a gel-type thermal interface material, which adsorbs more grease by disposing a plurality of thermally conductive fillers and increasing the surface area of the thermally conductive fillers, thereby achieving the purpose of suppressing oil bleeding. But unlike gel-type thermal interface materials that use solvents, in the preparation of gap pad materials, the viscosity of the mixture during the preparation process will be greatly increased, which leads to difficulties in operation, if the surface area of the thermally conductive fillers is simply increased. In addition, in terms of product properties, the solution of increasing the specific surface area by reducing the particle size of the fillers to reduce the oil bleeding rate has the following problem: due to the increase in the proportion of fillers with small particle size, the overall packing density of the fillers increases, resulting in a drastic decrease in the compressibility of the material, which eventually leads to poor overall performance of the product.

Therefore, there is still a need in the art to develop a thermal interface material or thermal gap pad material which can effectively prevent the occurrence of oil bleeding while ensuring high thermal conductivity and ease of operation, so that thermal gap pad materials with a range of thermal conductivity coefficients may be produced.

SUMMARY

This section provides a general summary of the disclosure, and is not a comprehensive disclosure of its full scope or all of its features.

In view of the above, the present disclosure proposes thermal gap pad materials (broadly, thermal interface materials), which could achieve technical effects of preventing, reducing, or mitigating oil bleeding while ensuring thermal conductivity and ease of operation, and maintaining mechanical properties such as flexibility and compressibility of the material, by designing the morphology and the filling degree of a thermally conductive filler and reasonably combining high-purity silicone resins with different viscosities.

One aspect of the present disclosure provides a thermal gap pad material (broadly, a thermal interface material) comprising a matrix material and a thermally conductive filler, wherein the thermally conductive filler has particles which are approximately spherical in shape when observed using a scanning electron microscope, an average particle diameter (D50) of 2-120 μm, and an average degree of sphericity of 70%-90%. The thermal gap pad material of the present disclosure may be in the form of a thermally conductive gasket.

According to an embodiment of the present disclosure, the matrix material is a silicone resin, and the viscosity of the resin can be reasonably selected according to various requirements on thermal conductivity coefficient of the final product. For example, the viscosity of the resin may be 100 to 10000 cps.

According to an embodiment of the present disclosure, the thermally conductive filler may be one or more selected from aluminum hydroxide (ATH), aluminum oxide ($Al_2O_3$), aluminum nitride, and silicon carbide (SiC).

According to a specific embodiment of the present disclosure, the specific surface area (SSA) of the thermally conductive filler may be 0.01-1.3 $m^2/g$.

According to a specific embodiment of the present disclosure, the average degree of sphericity of the thermally conductive filler may be preferably 75-90%.

According to an embodiment of the present disclosure, the thermally conductive filler may be included in an amount of 75-96 wt % based on a total weight of the thermal gap pad material.

In addition, the matrix material may be included in an amount of 3-25 wt % based on a total weight of the thermal gap pad material.

According to an embodiment of the present disclosure, the thermal gap pad material may further comprise other additives such as a coupling agent, toner, or pigment paste.

According to an embodiment of the present disclosure, the thermal conductivity of the thermal gap pad material is 1.0 W/mK or more, for example, 1.0 W/mK to 3.0 W/m·K.

According to the present disclosure, the thermal gap pad material has the functional characteristics of low or no oil bleeding while ensuring the designed thermal conductivity coefficient value, and has mechanical properties of both excellent material flexibility and compressibility.

Another aspect of the present disclosure provides a method for preparing the thermal gap pad material (broadly, a thermal interface material), comprising: evenly stirring and mixing the silicone resin and the thermally conductive filler, then heating and curing the obtained mixture to obtain a thermal gap pad material with a certain thickness, wherein the thermally conductive filler has an average particle diameter (D50) of 2-120 and an average degree of sphericity of 70-90%.

According to the preparation method of one embodiment of the present disclosure, the thermally conductive filler is included in an amount of 75-96 wt % based on a total weight of the thermal gap pad material; the matrix material is included in an amount of 3-25 wt % based on a total weight of the thermal gap pad material.

According to the preparation method of one embodiment of the present disclosure, a silicone resin with an appropriate viscosity is selected according to the basic requirements of the thermal conductivity coefficient of the final product. In some embodiments, the silicone resin is prepared by reacting a vinyl silicone oil with a hydrogen-containing silicone oil.

According to the preparation method of one embodiment of the present disclosure, in the step of mixing the silicone resin and the thermally conductive filler, the silicone resin, the thermally conductive filler, and optionally other additives such as a coupling agent can be uniformly mixed together with stirring.

According to the preparation method of one embodiment of the present disclosure, the heating and curing can be performed on a thermoforming machine. Also, the heating and curing may be performed by heating at a temperature of 100 °C to 150 °C for 15 to 50 minutes.

According to the preparation method of one embodiment of the present disclosure, the thickness of the thermal gap pad material after heating and curing may be 0.25-8 mm. The heat gap pad material prepared by the preparation method of the present disclosure may be in the form of a thermally conductive gasket.

According to the present disclosure, by using a quasi-spherical thermally conductive filler with a specific morphology (or a specific degree of sphericity), the filler may be mixed in a larger filling amount with the matrix material resin without rendering the viscosity of the mixed slurry too high to lose operability, thereby allowing the resultant thermally conductive mixture to have a low viscosity of the mixture to facilitate the operation and molding, and to improve the thermal conductivity coefficient by filling more fillers at the same mass fraction, as compared to the case of using a thermally conductive filler with perfectly spherical or irregular shapes (such as a fibrous, block or triangular shape). On the other hand, the thermally conductive filler with a specific degree of sphericity has a high specific surface area, so that more grease derived from the matrix material can be adsorbed, thereby preventing the occurrence of oil bleeding, as compared with a thermally conductive filler with perfectly spherical or irregular shapes.

Further areas of applicability will become apparent from the description provided herein. The description and specific examples in this summary are intended for purposes of illustration only and are not intended to limit the scope of the present disclosure.

DRAWINGS

The drawings in the present disclosure are provided for illustration of selected examples only, rather than all possible embodiments, and are not intended to limit the scope of the present disclosure.

DETAILED DESCRIPTION

Figure 1A:
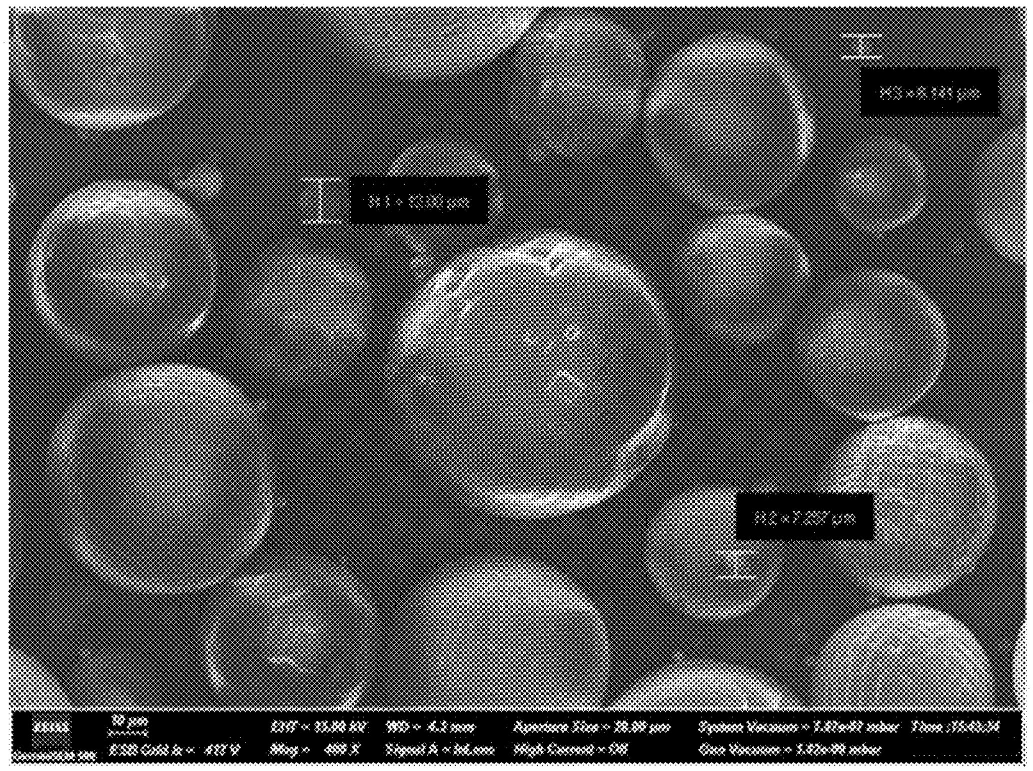
FIG. 1A is a scanning electron microscope (SEM) photograph showing the morphology of thermally conductive filler particles with an average degree of sphericity of about 100%.

Hereinafter, the present disclosure will be described in more details.

It should be understood that the terms used in the specification and the claims can be interpreted as having meanings consistent with their meanings in the context of the relevant fields and the technical idea of the present disclosure on the basis of the principle that the inventors can properly define the terms. The terms are used in the specification for illustrating exemplary embodiments only, and are not intended to limit the present disclosure.

It should be further understood that when used in this specification, the term "including", "comprising" or "having" indicates the presence of the stated feature, number, step, element or combinations thereof, but does not exclude the presence or addition of one or more other features, numbers, steps, elements or combinations thereof.

The term "% by weight" or "wt %" used herein refers to the percentage content by weight. In addition, "%" with no unit means "% by weight" when indicating a content, unless otherwise specified. In addition, when referring to "part(s)", it generally means "part(s) by weight".

The issue of oil bleeding is present in current thermal gap pad materials. Therefore, it is an urgent and important matter to produce low oil bleeding thermal gap pad materials that meet the function and performance requirements of electronic manufacturers.

As mentioned above, in the prior art, there are technical solutions of suppressing oil bleeding by increasing the surface area of the thermally conductive filler to adsorb more grease. However, the inventors of the present disclosure have found that if simply focusing on increasing the surface area of the thermally conductive filler, the viscosity of the mixture will be too high, which is not unfavorable to operation, during the preparation of a thermal gap pad material in the form of a gasket. Moreover, when a filler with an irregular shape (such as a block, flake, dendrite shape) is used to increase the surface area for adsorption, an issue of more serious oil bleeding or deterioration in flexibility may arise in the resultant thermal gap pad material.

In addition, the increase in the viscosity of the mixture brings difficulties to press molding, and in terms of the final properties of the product, the mechanical properties of the material may be sharply deteriorated, which is disadvantageous, if only a filler having a small particle diameter is used to lower the oil bleeding without paying attention to the morphology of the filler.

Upon extensive and intensive research, the inventors of the present disclosure have found that the grease produced from the thermal gap pad material will be adsorbed therein without bleeding by increasing the specific surface area of the filler, through selection of a thermally conductive filler (such as alumina or aluminum hydroxide) in the thermal gap pad material that has a quasi-spherical shape with a specific degree of sphericity. Meanwhile, the quasi-spherical thermally conductive filler also maintains a high filling degree of the spherical filler, thereby achieving high thermal conductivity.

Specifically, the inventors found that in order to achieve the functional characteristics of low oil bleeding under different thermal conductivity coefficients, it is generally considered that a method of replacing the filler with fillers having a smaller particle size to increase the overall specific surface area of the thermally conductive filler is easy and feasible, though theoretically these fillers with smaller particle sizes can absorb more oil and prevent small molecule resins from precipitation, this method may lead to a drastic increase in the viscosity of the compounded material, reducing the operability in the production process and lowering the mechanical properties of the final product to lose compressibility. Another conventional method is to change the morphology of the filler from a spherical shape to an irregular shape (such as a fibrous or flake shape) while keeping the particle size of the filler unchanged. This may also reduce oil bleeding, but the filler with an irregular shape also tends to drastically increase the viscosity of the compounded material, thereby reducing the content of the filler in the slurry, which limits this method to the preparation of thermally conductive products with low thermal conductivity coefficient, as compared to a spherical filler. In addition, the final product has a significantly higher compressive strain force, e.g., deteriorated flexibility, as compared to the case of a spherical filler.

In order to solve this problem, as mentioned above, the present disclosure uses a quasi-spherical thermally conductive filler, which has an increased specific surface area capable of adsorbing more grease so as to prevent oil bleeding, while achieving a larger filling amount to ensure high thermal conductivity. Further, the resultant thermal gap pad material also has excellent flexibility.

Here, flexibility or compressibility is one of the major properties of thermal gap pad materials. The better the flexibility of the material, the higher the deformation under pressure, namely the compressibility, suggesting that the sample has better compressibility and a smaller tightening force may be applied during fitting to accomplish the fitting of the gasket, which is advantageous in avoiding damage to other delicate parts resulted from overly high tightening force during fitting. In addition, better flexibility of the thermal gap pad material dictates better wettability between the material surface and the surface of the device in contact therewith, and that the material can "fit" an uneven device surface to a greater extent to expulse air between the material and the device, greatly reducing the contact thermal resistance between the material and the device. Preferably, the flexibility, expressed as a deformation value at 20 psi, may be 20% to 40%.

The thermal gap pad material of the present disclosure comprises a matrix material and a thermally conductive filler, wherein the thermally conductive filler has particles which are approximately spherical in shape when observed using a scanning electron microscope, an average particle diameter (D50) of 2-120 and an average degree of sphericity of 70-90%. Specifically, the thermal gap pad material of the present disclosure is in the form of a thermally conductive gasket.

Firstly, the thermally conductive filler will be described. The type of thermally conductive filler is not particularly limited as long as it is a filler commonly used in thermal gap pad materials or thermal interface materials. As an example, the thermally conductive filler may be selected from aluminum hydroxide, aluminum oxide, aluminum nitride, silicon carbide, and the like. Preferably, from the viewpoint of obtaining high thermal conductivity, the thermally conductive filler may be selected from aluminum hydroxide or aluminum oxide.

As mentioned above, the thermally conductive filler of the present disclosure is particulate, and when observed with a scanning electron microscope, the particles of the thermally conductive filler are approximately spherical in shape. Specifically, the thermally conductive filler is a quasi-spherical thermally conductive filler having an average degree of sphericity of 70% to 90%. The present inventors have discovered that it is possible to prevent oil bleeding while ensuring high thermal conductivity, with ease in handling during the preparation, by controlling the particulate morphology of the thermally conductive filler. Further, the packing degree of spherical particles is maintained, thus ensuring the flexibility of the resultant thermal gap pad material, by using a quasi-spherical thermally conductive filler.

Sphericity, a parameter that describes the shape of the thermally conductive filler, is also known as the degree to which the particle is close to a sphere. The degree of sphericity of the particle closer to 1 (100%) indicates that the particle is closer to a geometric sphere. The morphology of particles can be measured by scanning electron microscopy, and the degree of sphericity can be determined through calculation. Regarding the average sphericity of the particles, it can be determined by calculation using conventional methods in the art. Thermally conductive fillers with a specific average sphericity are commercially available in the market, for example, thermally conductive fillers with an average degree of sphericity of 70% to 95% are common.

Figure 1B:
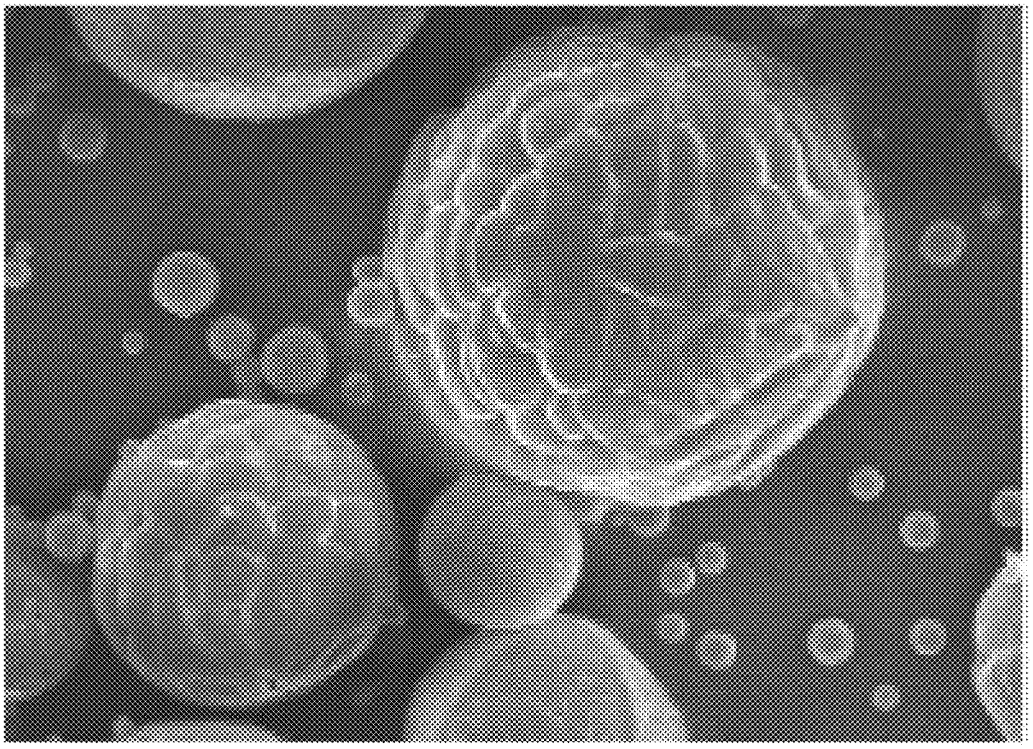
FIG. 1B is a SEM photograph showing the morphology of thermally conductive filler particles with an average degree of sphericity of about 85%.

In this regard, reference is made to FIG. 1A which shows the morphology of particles that are approximately perfectly spherical, that is, having an average degree of sphericity close to 100%; reference is also made to FIG. 1B which shows the morphology of quasi-spherical particles with an average degree of sphericity of about 85%.

Figure 1C:
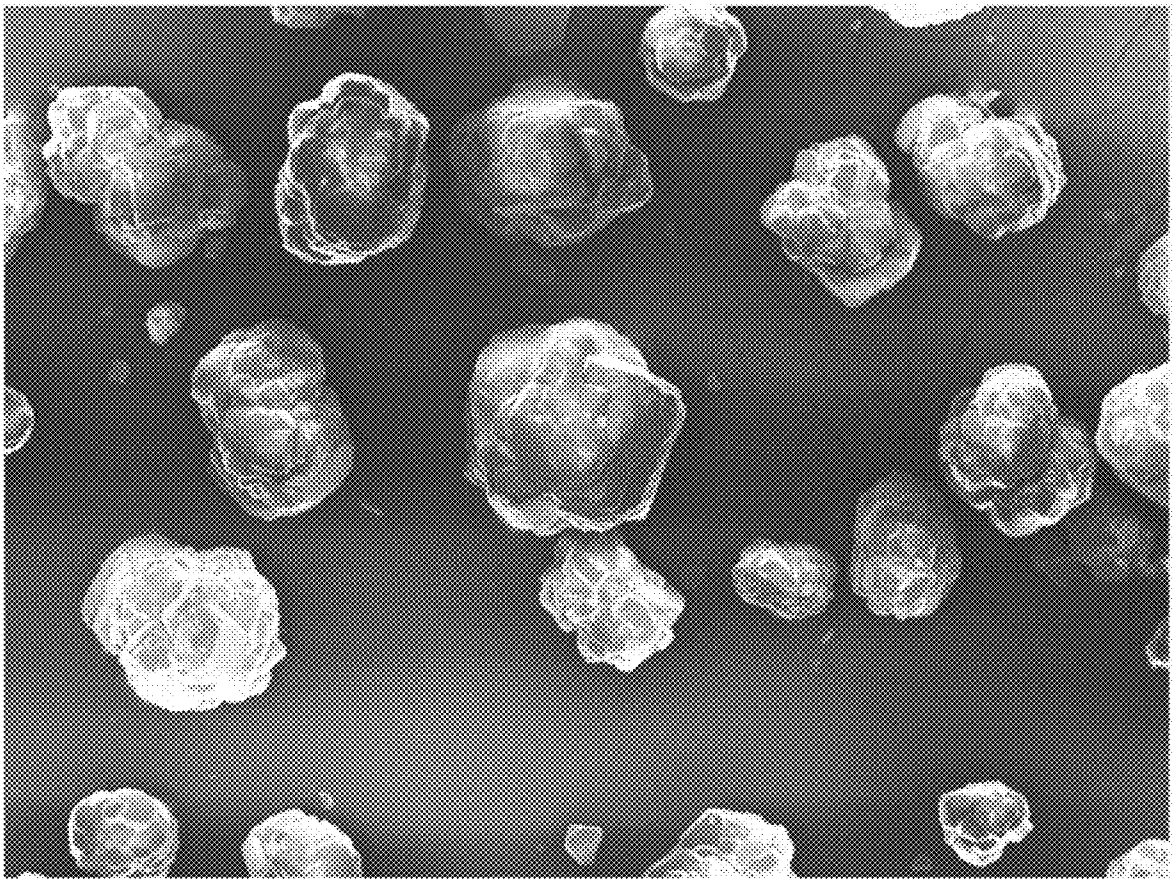
FIG. 1C is a SEM photograph showing the morphology of thermally conductive filler particles with an average degree of sphericity of about 65%.
Figure 2A:
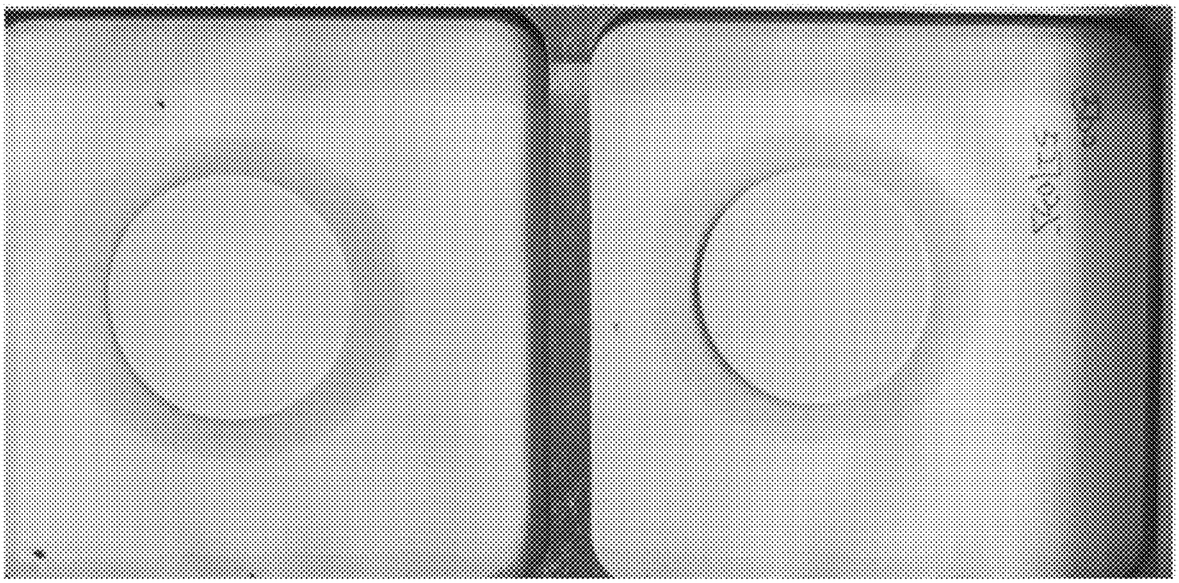
FIG. 2A is a schematic photograph of oil bleeding from a circular gasket of Comparative Example 1 of the present disclosure.
Figure 2B:
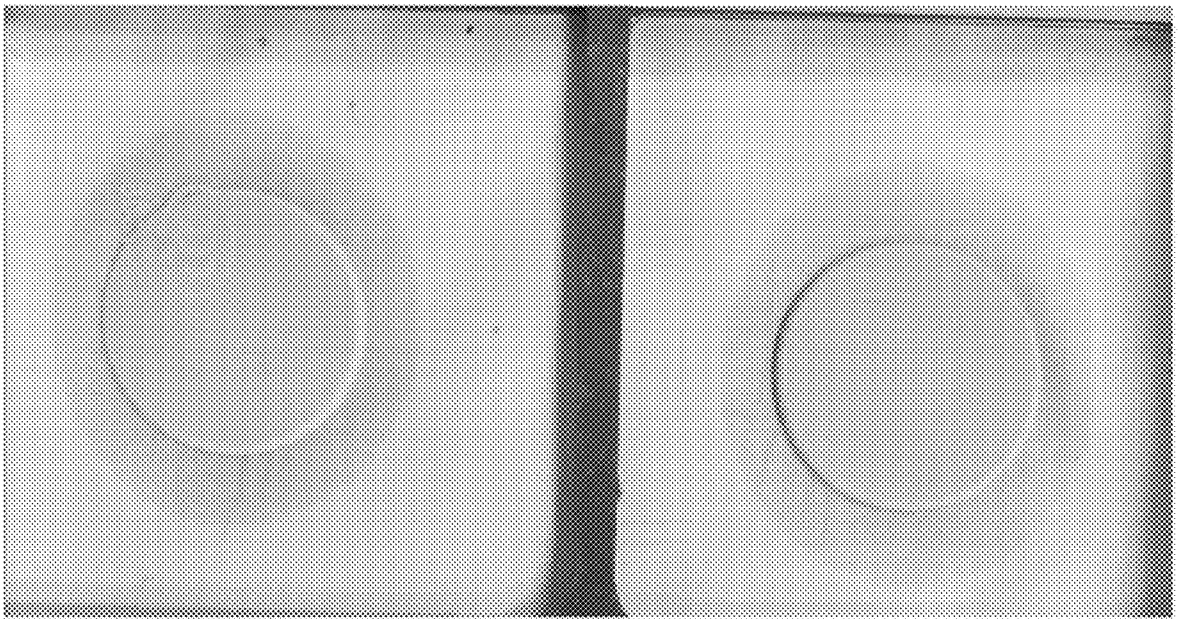
FIG. 2B is a schematic photograph of oil bleeding from a circular gasket of Comparative Example 2 of the present disclosure.
Figure 3A:
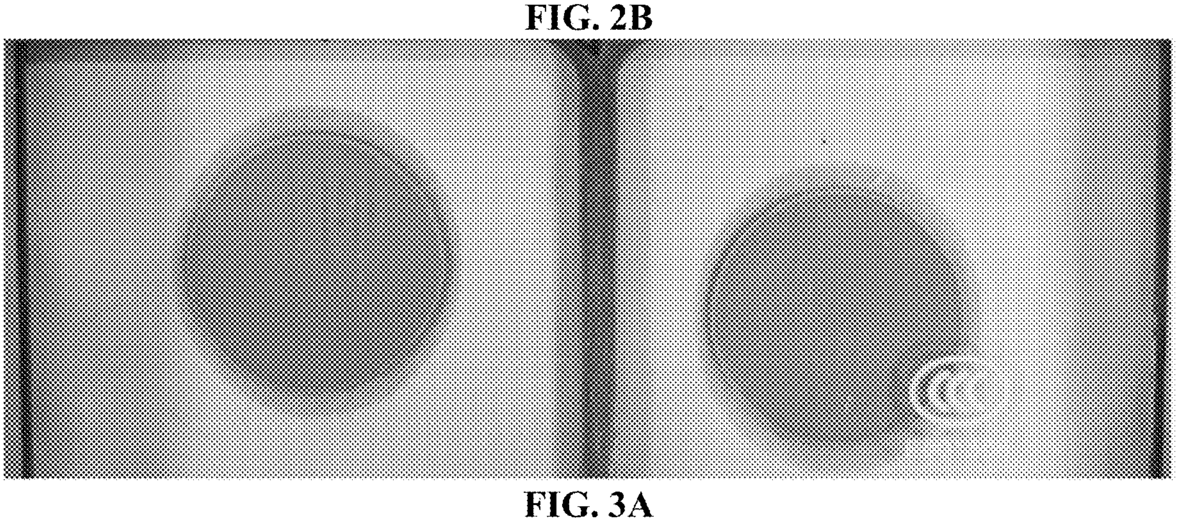
FIG. 3A is a schematic photograph of oil bleeding from a circular gasket of Example 1 of the present disclosure.
Figure 3B:
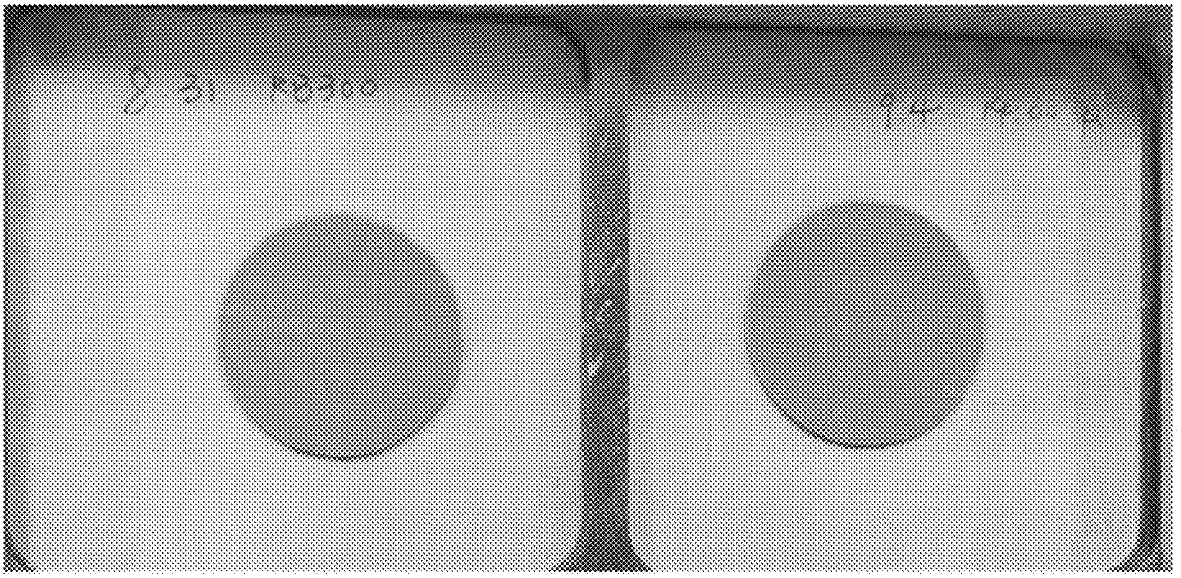
FIG. 3B is a schematic photograph of oil bleeding from a circular gasket of Example 2 of the present disclosure.
Figure 3C:
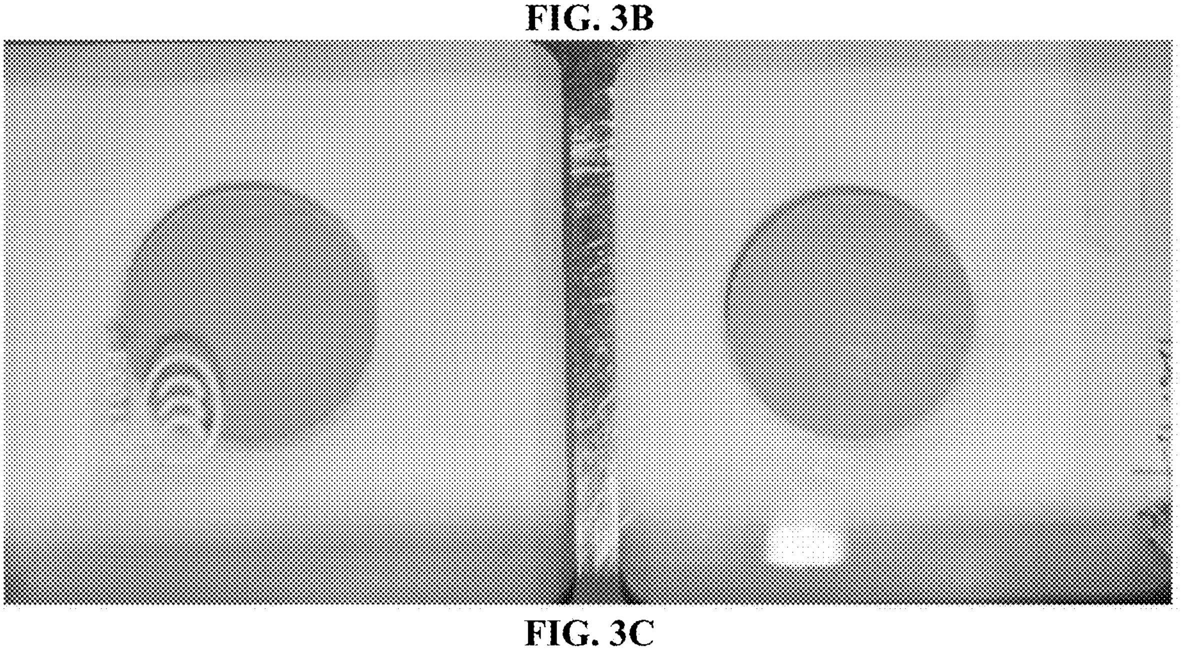
FIG. 3C is a schematic photograph of oil bleeding from a circular gasket of Example 3 of the present disclosure.

In addition, a lower average degree of sphericity indicates deviation from a spherical shape. For example, when the average degree of sphericity is 65%, the thermally conductive filler can be considered to be irregularly shaped or block-shaped (cube-shaped). Reference is made to FIG. 1C which shows the morphology of cube-shaped particles with an average degree of sphericity of about 65%.

The thermally conductive filler of the present disclosure has an average degree of sphericity of preferably 75% to 90%, more preferably 75% to 85%. When the average degree of sphericity of the thermally conductive filler satisfies the above range, it is believed that the filler particles are close to a spherical shape while having irregularities on the surface thereof, so as to have a larger specific surface area, which allows adsorption of more grease to prevent occurrence of oil bleeding. When the average degree of sphericity is too high and beyond the above range, the specific surface area of the thermally conductive filler decreases, which is unfavorable for preventing oil bleeding; and when the average degree of sphericity is too low and beyond the above range, the filling degree of the thermally conductive filler significantly decreases, resulting in sharp increase of the viscosity of the slurry, which is unfavorable to the operability of the preparation process and the preparation of materials with high thermal conductivity.

Also, when a thermally conductive filler with an irregular shape is used to increase the specific surface area, there is even an issue of more serious oil bleeding or deterioration in flexibility. Further, the method of increasing the specific surface area by using a thermally conductive filler with an irregular shape will also cause a drastic increase in the viscosity of the mixture. As shown in the comparative examples of the present disclosure, in the case that the filling amount of the filler is about 80 wt %, the viscosity of the mixture is already close to the upper limit for operable molding; moreover, the morphology of block-shaped fillers also leads to lowered mechanical properties of the product. In addition, the use of block-shaped fillers is limited in that a high filling amount greater than 80 wt % cannot be achieved, and therefore products with high thermal conductivity cannot be obtained.

The thermally conductive filler of the present disclosure is particulate, and the average particle diameter thereof may be characterized by a D50 value. Specifically, the D50 value is a value measured by using a Malvern particle diameter analyzer or a Horiba laser particle diameter analyzer. As mentioned above, the average particle diameter of the thermally conductive filler is 2 μm to 120 μm, preferably 5 μm to 70 μm, more preferably 10 μm to 50 μm, e.g., 20 μm, 30 μm or 40 μm. When the average particle diameter of the thermally conductive filler satisfies the above range, an optimized combination of thermal conductivity and oil absorption may be achieved. When the average particle diameter is too small and lower than the above range, fillers with smaller particle diameters will dramatically increase the viscosity of the compounded material, thereby reducing the operability and lowering the mechanical properties of the final product.

As mentioned above, the quasi-spherical thermally conductive filler has a larger specific surface area, due to the uneven morphology of the spherical surface. Specifically, referring to FIGS. 1A and 1B, the specific surface area of the quasi-spherical thermally conductive filler of the present disclosure can be greatly increased, as compared with that of a perfectly spherical surface. Specifically, for each particle, the specific surface area of the quasi-spherical thermally conductive filler of the present disclosure may be 0.01 $m^2/g$ to 1.3 $m^2/g$, preferably 0.2 $m^2/g$ to 1.1 $m^2/g$, for example, 0.25 $m^2/g$, 0.3 $m^2/g$, 0.4 $m^2/g$, and the like. The specific surface area satisfying the above range can adsorb excess grease present in the thermal gap pad material, thereby preventing oil bleeding. In the present disclosure, the specific surface area of the thermally conductive filler can be determined by a conventional BET specific surface area testing method.

The filling amount (content) of the thermally conductive particles may be 75 wt % to 96 wt %, preferably 80 wt % to 95 wt %, more preferably 85 wt % to 95 wt %, based on a total weight of the thermal gap pad material. The specific filling amount of the filler depends on the requirement of thermal conductivity coefficient. When the filling amount satisfies the above range, a thermal gap pad material with high thermal conductivity may be readily obtained, and thus thermal gap pad material products with a range of different thermal conductivities can be prepared.

The matrix material will be described below. The matrix material of the thermal gap pad material may be a resin matrix material. Specifically, the resin matrix material may include silicone resin, oil-gel resin, and the like. In the case where a silicone resin is used, a silicone thermal grease with silicone oil as a carrier, which is a known high-performance paste-like thermal interface material, may be formed.

Generally, the silicone resin refers to a polysiloxane product with a Si—O—Si skeleton that maintains a liquid state at room temperature, usually having a general structure represented by the following chemical formula 1:

[Chemical Formula 1]

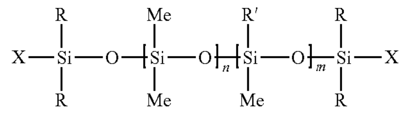

wherein R is alkyl, or aryl; R' is alkyl, aryl, alkenyl, hydrogen, a carbon functional group, a polyether segment, or the like; X is alkyl, aryl, alkenyl, hydrogen, chlorine, hydroxyl, alkoxy, acetoxy, a carbon functional groups, a polyether chain segments, or the like; m and n are integers greater than 1, such as 1 to 1000.

Furthermore, the matrix material of the present disclosure also includes a liquid silicone rubber system. The silicone rubber of such a system has a small molecular weight, a medium degree of polymerization and low viscosity, and may undergo cross-linking reaction at an appropriate high temperature to form an elastomer. Liquid silicone rubber can be categorized into condensation and addition type systems. Among them, the addition-type thermally conductive silicone rubber is a thermally conductive silicone rubber prepared by mixing an addition-type silicone rubber component and an inorganic filler. In this case, a vinyl silicone oil and a hydrogen-containing silicone oil can be used, which are subjected to crosslinking under the catalytic action of a Pt-based catalyst to form a thermally conductive silicone rubber matrix.

In this case, a chloroplatinic acid ($H_2PtCl_6 \cdot 6H_2O$) complex compound or the like can be used as a hydrosilylation catalyst. The vinyl silicone oil and hydrogen-containing silicone oil are essential raw materials for the preparation of addition-type vulcanized silicone rubber elastomers. In this case, the hydrogen-containing silicone oil is generally a low-viscosity linear methyl hydrogen-containing silicone oil containing two or more Si—H groups, which is regarded as a crosslinking agent in the hydrosilylation reaction. It may crosslink with vinyl groups on different vinyl siloxane chains under the action of a platinum catalyst, which allows dispersed vinyl siloxane chains to be crosslinked together to form a network structure.

However, in the case of using vinyl silicone oil and hydrogen-containing silicone oil, it has been found that unreacted vinyl silicone oil raw material, as well as the impurity components present in this raw material, remained in the final product. These small molecular substances that are not crosslinked to form a network structure (or a part of uncrosslinked macromolecular substances) constitute the majority of the grease in the product and cannot be readily maintained in conventional thermal gap pad materials, and they bleed from the surface of the product in use and lead to pollution.

The present inventors have found that by selecting a thermally conductive filler having a quasi-spherical morphology with a specific degree of sphericity, the specific surface area of the thermally conductive filler may be increased, and the uncrosslinked grease may be better adsorbed, thereby preventing the occurrence of oil bleeding.

As vinyl silicone oil, common examples thereof include vinyl silicone oil with a viscosity of 200 cps to 10000 cps, preferably 1000 cps to 5000 cps; as hydrogen-containing silicone oil, common examples thereof are hydrogen-containing silicone oil with a viscosity of 200 cps to 10000 cps, preferably 1000 cps to 5000 cps. Among them, the specific viscosities of vinyl silicone oil and hydrogen-containing silicone oil can be reasonably selected within a range of viscosity according to the designed requirements on the thermal conductivity coefficient of the product. For example, a relatively high thermal conductivity coefficient designed for the product means more thermally conductive fillers need to be filled, and in this case a silicone oil with a lower overall viscosity is preferred, so as to avoid an excessively high viscosity, in which case there is no wetting effect on the fillers and uniform mixing cannot be achieved.

The content of the matrix material may be 3 wt % to 25 wt %, preferably 4 wt % to 25 wt %, more preferably 5 wt % to 20 wt %, still further preferably 5 wt % to 15 wt %, based on a total weight of the thermal gap pad material. The specific content is determined according to the designed thermal conductivity coefficient of the product.

According to the present disclosure, the thermal gap pad material may include the aforementioned matrix material and thermally conductive filler. However, the thermal gap pad material may also contain other additives, such as a coupling agent, a toner or a pigment paste, wherein the examples of the coupling agent include phthalate coupling agents, ethoxy coupling agents or methoxy coupling agents.

The content of other additives may be 0.05% to 5%, preferably 1% to 2%, e.g., 1.5%, based on the total weight of the thermal gap pad material.

Another aspect of the present disclosure provides a method for preparing the above-mentioned thermal gap pad material, comprising: evenly stirring and mixing the silicone resin and the thermally conductive filler, then heating and curing the obtained mixture to obtain a thermal gap pad material with a certain thickness, wherein the thermally conductive filler has an average particle diameter (D50) of 2-120 and an average degree of sphericity of 70-90%. The resultant thermal gap pad material is in the form of a thermally conductive gasket.

Unlike the preparation of gel-type thermal interface materials, no solvents are used in the preparation of the thermal gap pad materials of the present disclosure. Thus, it is crucial to maintain a proper viscosity of the resultant mixture for the operability of the manufacturing process and the performance of the final product.

According to an embodiment of the present disclosure, the content of the thermally conductive filler is 75 wt % to 96 wt %, based on the total weight of the thermal gap pad material; the content of the matrix material is 3 wt % to 25 wt %, based on the total weight of the thermal gap pad material. The selection of the thermally conductive filler and the matrix material has been described in detail above, and will not be repeated here.

For the step of mixing the silicone resin and the thermally conductive filler, a silicone resin with an appropriate viscosity can be selected according to the basic requirements on the thermal conductivity of the final product. For example, the viscosity of the silicone resin can be 200 cps to 10000 cps, preferably 1000 cps to 5000 cps, so as to adapt to thermally conductive fillers of various types or particle diameters.

In the case that the silicone resin is prepared by reacting vinyl silicone oil with hydrogen-containing silicone oil, the preparation method of the present disclosure further comprises a step of evenly mixing vinyl silicone oil and hydrogen-containing silicone oil as well as an optional catalyst before mixing the thermally conductive filler and the matrix material. In addition, in this case, the preparation method of the present disclosure further comprises a crosslinking step after mixing the thermally conductive filler and the matrix material. For the crosslinking process, a crosslinking process conventionally used in the art can be used.

In the case that other additives are included in the thermal gap pad material, in the step of mixing the silicone resin and the thermally conductive filler, the silicone resin, the thermally conductive filler, and optionally other additives such as a coupling agent can be evenly mixed together with stirring.

For the step of heating and curing, it may be conducted by heating at a temperature of 100 °C to 150 °C for 15 to 50 minutes. Specifically, the heating and curing may be performed at a temperature of 120 °C to 130 °C for 20 to 30 minutes. The heating and curing can also be performed on a thermoforming machine, which is not limited as long as it can heat and cure the resultant mixture and can press the mixture into a gasket. The thickness of the thermally cured thermal gap pad material may be 0.25 mm to 8 mm, for example 0.5 mm to 5 mm.

The thermally conductive filler having a specific degree of sphericity of the present disclosure may be commercially available. For example, alumina particles with an average degree of sphericity of 70% to 95% can be purchased from Ya'an Bestry Performance Materials Co., Ltd. In addition, vinyl silicone oil and hydrogen-containing silicone oil may also be commercially available, for example, the silicone oil products marketed by Nuisl Inc., US.

According to the above-mentioned preparation method of the present disclosure, a flexible and compressible low oil bleeding thermal gap pad material can be prepared.

The thermal gap pad material of the present disclosure can be applied in various fields such as automobile control unit, power supply and semiconductor, processor, flat panel display and consumer electronics.

EXAMPLES

The present disclosure will be described in more detail below in conjunction with the examples. It should be understood that the present disclosure is not limited to these examples.

The sources of the raw materials used in the following examples are disclosed as follows:

Vinyl silicone oil and hydrogen-containing silicone oil: Nuisl Inc., US;

Aluminum hydroxide: Chinalco Henan Aluminum Fabrication Co., Ltd.;

Alumina: Ya'an Bestry Performance Materials Co., Ltd.;

Titanate coupling agent: Kenich Inc., US.

Test Method

Thermal Conductivity Test Method:

According to the ASTM D5470-12 standard test method, a thermally conductive gasket with a sample size of 26 mm×26 mm and a thickness of <5 mm with a flat surface was chosen and placed between a hot end and a cold end, for which the pressure could be set, under a set state of stable heat transfer. The thermal conductivity of the sample was calculated from the monitored heat flow through the sample and the temperatures of the hot and the cold surfaces.

Oil Bleeding Test Method 1:

A circular gasket with a diameter of 28.6 mm and a thickness of 2.5 mm (the circular test product obtained in the following examples and comparative examples) was placed on an A4 paper and integrally placed into an oil bleeding fixture, and the compression rate was controlled at 50%. After baked in an oven at 160 °C for 3 days, the fixture was removed and cooled to room temperature for 3 hours, and the diameter D1 of the material gasket and the diameter D2 of the largest oil ring were measured.

The oil bleeding rate was calculated by using D1 and D2 according to an equation:

$$\text{Oil bleeding rate}=(D2-D1)/D1\times100\%.$$

In this method, the test results with an oil bleeding rate <20% are evaluated as qualified. Here, it is noteworthy that for an application field with a high requirement on oil bleeding performance, this test method is mostly used for oil bleeding control.

Oil Bleeding Test Method 2:

A circular gasket with a diameter of 28.6 mm and a thickness of 2.5 mm (the circular test product obtained in the following examples and comparative examples) was weighed as a weight M1. The gasket was wrapped with a layer of glass fiber cloth on both the top and the bottom thereof, and three layers of filter paper were respectively added on the top and the bottom of the glass fiber-wrapped circular gasket. Then, it was placed into an oil bleeding fixture, and the compression rate of the gasket was controlled to be 50%. After baked in an oven at 125 °C for 3 days, it was removed and cooled to room temperature, and the gasket with the glass fiber was weighed as a weight M2.

The weight loss rate was calculated using M1 and M2 according to an equation:

$$\text{Weight loss rate}=(M2-M1)/M1\times100\%.$$

In this method, a test result with a weight loss rate of <3% is evaluated as qualified.

Mixture Viscosity Test Method:

A Brookfield-8536224 rotational viscometer was chosen for the test of the viscosity of a well stirred mixture, when the torque was controlled within the range of 40% to 80% by choosing an appropriate rotor and rotational speed, and once the viscosity data remained substantially at a stable value after 2 minutes, the data were obtained as the final viscosity test data.

Deformation Test Equipment:

Deformation was tested by a MTS Deformation Tester Model 10257169 from the MTS System Corporation. For a circular gasket having a sample dimension with a diameter of 28.6 mm and a thickness of 2.5 mm, at a test speed of 10 mil/min, the deformation value under a test pressure of 20 psi was recorded.

Specific Surface Area Test Method:

A Micromeritics Specific Surface Area Tester, Model Gemini 2390, was used to measure the specific surface area by BET method.

Comparative Example 1

In this example, 15 parts of vinyl silicone resin with a viscosity of 500 cps, 5 parts of hydrogen-containing silicone resin with a viscosity of 500 cps, and 79 parts of a block-shaped (average degree of sphericity: 65%) aluminum hydroxide having a D50 of 20 μm, and 1 part of a titanate coupling agent were used.

The vinyl silicone resin and the hydrogen-containing silicone resin were placed in a stirring pot and stirred at a speed of 40 rpm for 10 minutes, followed by addition of 79 parts of aluminum hydroxide and 1 part of the titanate coupling agent, and stirring was resumed at 30 rpm for 5 minutes. Thereafter, a vacuum pump was turned on for vacuum pumping until a vacuum degree of −98 Mpa was reached, and stirring was resumed for 15 minutes. After the stirring was finished, the stirring paddle was lifted and the residual powder around the stirring pot was scraped off with a spatula, and stirring was resumed under −98 Mpa at 20 rpm for 10 minutes, before the mixture was placed into a molding machine for pressing and baking. The resultant was processed into a circular gasket with a diameter of 28.6 mm and a thickness of 2.5 mm for testing.

The viscosity of the mixture after stirring, and the thermal conductivity coefficient, oil bleeding rate and weight loss rate (by oil bleeding test methods 1 and 2, respectively), and the deformation at 20 psi of the product of the circular gasket of Comparative Example 1 were tested by using the test methods described above. The results are shown in Table 1 below.

Comparative Example 2

In this example, 15 parts of vinyl silicone resin with a viscosity of 500 cps, 5 parts of hydrogen-containing silicone resin with a viscosity of 500 cps, and 79 parts of alumina with an average degree of sphericity of 97% (perfect spheres) having a D50 of 20 μm, and 1 part of a titanate coupling agent were used.

The vinyl silicone resin and the hydrogen-containing silicone resin were placed in a stirring pot and stirred at a speed of 40 rpm for 10 minutes, followed by addition of 79 parts of alumina and 1 part of the titanate coupling agent, and stirring was resumed at 30 rpm for 5 minutes. Thereafter, a vacuum pump was turned on for vacuum pumping until a vacuum degree of −98 Mpa was reached, and stirring was resumed for 15 minutes. After the stirring was finished, the stirring paddle was lifted and the residual powder around the stirring pot was scraped off with a spatula, and stirring was resumed under −98 Mpa at 20 rpm for 10 minutes, before the mixture was placed into a molding machine for pressing and baking. The resultant was processed into a circular gasket with a diameter of 28.6 mm and a thickness of 2.5 mm for testing.

The viscosity of the mixture after stirring, and the thermal conductivity coefficient, oil bleeding rate and weight loss rate (by oil bleeding test methods 1 and 2, respectively), and the deformation at 20 psi of the product of the circular gasket of Comparative Example 2 were tested by using the test methods described above. The results are shown in Table 1 below.

Example 1

In this example, 15 parts of vinyl silicone resin with a viscosity of 500 cps, 5 parts of hydrogen-containing silicone resin with a viscosity of 500 cps, and 79 parts of alumina with an average degree of sphericity of 90% having a D50 of 20 and 1 part of a titanate coupling agent were used.

The vinyl silicone resin and the hydrogen-containing silicone resin were placed in a stirring pot and stirred at a speed of 40 rpm for 10 minutes, followed by addition of 79 parts of alumina and 1 part of the titanate coupling agent, and stirring was resumed at 30 rpm for 5 minutes. Thereafter, a vacuum pump was turned on for vacuum pumping until a vacuum degree of −98 Mpa was reached, and stirring was resumed for 15 minutes. After the stirring was finished, the stirring paddle was lifted and the residual powder around the stirring pot was scraped off with a spatula, and stirring was resumed under −98 Mpa at 20 rpm for 10 minutes, before the mixture was placed into a molding machine for pressing and baking. The resultant was processed into a circular gasket with a diameter of 28.6 mm and a thickness of 2.5 mm for testing.

The viscosity of the mixture after stirring, and the thermal conductivity coefficient, oil bleeding rate and weight loss rate (by oil bleeding test methods 1 and 2, respectively), and the deformation at 20 psi of the product of the circular gasket of Example 1 were tested by using the test methods described above. The results are shown in Table 1 below.

Example 2

In this example, 9 parts of vinyl silicone resin with a viscosity of 500 cps, 3 parts of hydrogen-containing silicone resin with a viscosity of 500 cps, and 87 parts of alumina with an average degree of sphericity of 75% having a D50 of 50 and 1 part of a titanate coupling agent were used.

The vinyl silicone resin and the hydrogen-containing silicone resin were placed in a stirring pot and stirred at a speed of 40 rpm for 10 minutes, followed by addition of 87 parts of alumina and 1 part of the titanate coupling agent, and stirring was resumed at 30 rpm for 5 minutes. Thereafter, a vacuum pump was turned on for vacuum pumping until a vacuum degree of −98 Mpa was reached, and stirring was resumed for 15 minutes. After the stirring was finished, the stirring paddle was lifted and the residual powder around the stirring pot was scraped off with a spatula, and stirring was resumed under −98 Mpa at 20 rpm for 10 minutes, before the mixture was placed into a molding machine for pressing and baking. The resultant was processed into a circular gasket with a diameter of 28.6 mm and a thickness of 2.5 mm for testing.

The viscosity of the mixture after stirring, and the thermal conductivity coefficient, oil bleeding rate and weight loss rate (by oil bleeding test methods 1 and 2, respectively), and the deformation at 20 psi of the product of the circular gasket of Example 2 were tested by using the test methods described above. The results are shown in Table 1 below.

Example 3

In this example, 9 parts of vinyl silicone resin with a viscosity of 2000 cps, 3 parts of hydrogen-containing silicone resin with a viscosity of 2000 cps, and 87 parts of alumina with an average degree of sphericity of 83% having a D50 of 50 and 1 part of a titanate coupling agent were used.

The vinyl silicone resin and the hydrogen-containing silicone resin were placed in a stirring pot and stirred at a speed of 40 rpm for 10 minutes, followed by addition of 87 parts of alumina and 1 part of the titanate coupling agent, and stirring was resumed at 30 rpm for 5 minutes. Thereafter, a vacuum pump was turned on for vacuum pumping until a vacuum degree of −98 Mpa was reached, and stirring was resumed for 15 minutes. After the stirring was finished, the stirring paddle was lifted and the residual powder around the stirring pot was scraped off with a spatula, and stirring was resumed under −98 Mpa at 20 rpm for 10 minutes, before the mixture was placed into a molding machine for pressing and baking. The resultant was processed into a circular gasket with a diameter of 28.6 mm and a thickness of 2.5 mm for testing.

The viscosity of the mixture after stirring, and the thermal conductivity coefficient, oil bleeding rate and weight loss rate (by oil bleeding test methods 1 and 2, respectively), and the deformation at 20 psi of the product of the circular gasket of Example 3 were tested by using the test methods described above. The results are shown in Table 1 below.

TABLE 1

| Test items | Comparative Example1 | Comparative Example 2 | Example 1 | Example 2 | Example 3 |
|---|---|---|---|---|---|
| Filler specific surface area/$m^2$/g | 0.52 | 0.25 | 0.33 | 0.21 | 0.15 |
| Oil bleeding rate - Method 1 | 43% | 58% | 12% | 3% | 8% |
| Oil bleeding rate - Method 2 | 2.3% | 2.7% | 0.7% | 0.3% | 0.5% |

TABLE 1-continued

| Test items | Comparative Example1 | Comparative Example 2 | Example 1 | Example 2 | Example 3 |
|---|---|---|---|---|---|
| Thermal conductivity coefficient/w/m · k | 1.22 | 1.33 | 1.41 | 2.43 | 2.37 |
| Deformation at 20 psi | 15% | 35% | 29% | 21% | 39% |
| Mixture viscosity/cps | 830000 | 156000 | 292000 | 794000 | 453000 |

It can be seen from Table 1 that the circular gaskets of Comparative Examples 1 and 2 passed the oil bleeding test method 2, but the oil bleeding rate was higher than 20% in the oil bleeding test method 1, failed to pass the oil bleeding test. In contrast, the circular gaskets of Examples 1 to 3 all passed both the oil bleeding test methods 1 and 2, and the oil bleeding rate and weight loss rate were significantly lower than those of Comparative Examples 1 and 2. In addition, referring to FIGS. 2A-2B and FIGS. 3A-3B, it can be seen that the thermal gap pad materials of Comparative Examples 1 and 2 have serious oil bleeding compared to those of Examples 1-3.

Further, as seen from the comparison between Comparative Examples 1 and 2 and Example 1, at the same filling rate (about 80%) of the filler, Example 1 achieves a lower oil bleeding rate and a higher thermal conductivity coefficient.

On the other hand, the block-shaped filler of Comparative Example 1 has the largest specific surface area (0.52 $m^2/g$) among the five examples, but it has a serious oil bleeding issue, and poor thermal conductivity, flexibility and preparation operability. It is clear that simply increasing the specific surface area of the filler cannot solve the oil bleeding issue, and also has an adverse effect on the thermal conductivity, flexibility and preparation operability of the product. Further, the mixture viscosity of the thermal gap pad material in Comparative Example 1 using block-shaped particles is excessively high, and there is also a drawback that the operability is reduced during the preparation process.

In addition, as seen from the comparison among Examples 1 to 3, by varying the average degree of sphericity (75% to 85%) of alumina particles, Examples 2 and 3 achieve a higher filling rate (87%) of the thermally conductive filler, with greatly improved thermal conductivity while achieving a lower oil bleeding rate, and this high thermal conductivity coefficient cannot be achieved with the block-shaped or perfectly spherical fillers of Comparative Examples 1 and 2. In addition, by selecting an appropriate average degree of sphericity, higher flexibility or preparation operability (mixture viscosity) can also be obtained.

It is clear that by selecting different silicone resin systems for thermally conductive particles with different average degrees of sphericity, the present disclosure could achieve higher thermal conductivity and lower oil bleeding, and improved flexibility or preparation operability, thereby meeting the requirements in various application fields.

Exemplary embodiments are disclosed of thermal interface materials that comprise a matrix material and a thermally conductive filler. The thermally conductive filler has particles which are approximately spherical in shape when observed using a scanning electron microscope, an average particle diameter (D50) of 2 μm-120 μm, and an average degree of sphericity of 70%-90%.

In exemplary embodiments, the matrix material is an organic silicon resin.

In exemplary embodiments, the thermally conductive filler is selected from one or more of aluminum hydroxide (ATH), aluminum oxide, aluminum nitride and silicon carbide.

In exemplary embodiments, the thermally conductive filler has a specific surface area (SSA) of 0.01 m2/g-1.3 m2/g.

In exemplary embodiments, the thermally conductive filler is included in an amount of 75 wt %-96 wt % based on a total weight of the thermal interface material.

In exemplary embodiments, the matrix material is included in an amount of 3 wt %-25 wt % based on a total weight of the thermal interface material.

In exemplary embodiments, the thermal interface material further comprises a coupling agent.

In exemplary embodiments, the thermal interface material is configured to have a thermal conductivity of 1.0 W/mK or more.

In exemplary embodiments, the thermal interface material further comprises one or more: electrically conductive filler(s); electromagnetic wave absorbing filler(s); dielectric absorbing filler(s); and filler(s) that has two or more properties of being thermally conductive, electrically conductive, dielectric absorbing, and electromagnetic wave absorbing.

In exemplary embodiments, the matrix material is an organic silicon resin; the thermally conductive filler is selected from one or more of aluminum hydroxide (ATH), aluminum oxide, aluminum nitride and silicon carbide; the thermally conductive filler has a specific surface area (SSA) of 0.01 m2/g-1.3 m2/g; the thermally conductive filler is included in an amount of 75 wt %-96 wt % based on a total weight of the thermal interface material; the matrix material is included in an amount of 3 wt %-25 wt % based on a total weight of the thermal interface material; and the thermal interface material has a thermal conductivity of 1.0 W/mK or more.

In exemplary embodiments, the thermal interface material is in the form of a thermally conductive gasket. In exemplary embodiments, the thermal interface material is in the form of a thermally conductive pad.

In exemplary embodiments, the thermally conductive filler particles are configured to decrease migration of materials from the thermal interface material. The thermally conductive filler particles may be configured to adsorb grease from the matrix material thereby reducing or preventing the occurrence of oil leakage from the thermal interface material.

In exemplary embodiments, a method for preparing a thermal interface material comprises: evenly stirring and mixing organic silicon resin and the thermally conductive filler, then heating and curing the obtained mixture to obtain the thermal interface material with a certain thickness, wherein the thermally conductive filler has an average particle diameter (D50) of 2 μm-120 μm, and an average degree of sphericity of 70%-90%. The organic silicon resin may be obtained by reacting a vinyl silicone oil with a hydrogen-containing silicone oil.

In exemplary embodiments, a composite comprises thermally conductive filler having particles that are approximately spherical in shape when observed using a scanning electron microscope, an average particle diameter (D50) of 2 μm-120 μm, and an average degree of sphericity of 70%-90%, whereby the thermally conductive filler particles are configured to decrease migration of materials from the composite.

In exemplary embodiments, the thermally conductive filler particles are configured to adsorb grease from a matrix material thereby reducing or preventing the occurrence of oil leakage from the composite.

In exemplary embodiment, a matrix material of the composite is an organic silicon resin.

In exemplary embodiments, the thermally conductive filler of the composite is selected from one or more of aluminum hydroxide (ATH), aluminum oxide, aluminum nitride and silicon carbide.

In exemplary embodiments, the thermally conductive filler of the composite has a specific surface area (SSA) of 0.01 m2/g-1.3 m2/g.

In exemplary embodiments, the thermally conductive filler is included in an amount of 75 wt %-96 wt % based on a total weight of the composite.

In exemplary embodiments, a matrix material of the composite is included in an amount of 3 wt %-25 wt % based on a total weight of the composite.

In exemplary embodiments, the composite further comprises a coupling agent.

In exemplary embodiments, the composite is configured to have a thermal conductivity of 1.0 W/mK or more.

In exemplary embodiments, the thermal interface material further comprises one or more: electrically conductive filler(s); electromagnetic wave absorbing filler(s); dielectric absorbing filler(s); and filler(s) that has two or more properties of being thermally conductive, electrically conductive, dielectric absorbing, and electromagnetic wave absorbing.

In exemplary embodiments, a matrix material of the composite is an organic silicon resin; the thermally conductive filler is selected from one or more of aluminum hydroxide (ATH), aluminum oxide, aluminum nitride and silicon carbide; the thermally conductive filler has a specific surface area (SSA) of 0.01 m2/g-1.3 m2/g; the thermally conductive filler is included in an amount of 75 wt %-96 wt % based on a total weight of the composite; the matrix material of the composite is included in an amount of 3 wt %-25 wt % based on a total weight of the composite; and the composite has a thermal conductivity of 1.0 W/mK or more.

In exemplary embodiments, the composite is configured to be usable for managing thermal and/or electromagnetic properties of a device or system.

In exemplary embodiments, the composite is a thermal management and/or electromagnetic interference (EMI) mitigation material. In exemplary embodiments, the composite is a thermal interface material, an EMI absorber, a thermally conductive absorber, an electrically conductive elastomer, an electrically conductive composite, or a combination of two or more thereof.

In exemplary embodiments, the composite is in the form of a thermally conductive pad and/or a thermally conductive gasket.

In exemplary embodiments, a device or system comprising a composite as disclosed herein that is used for managing thermal and/or electromagnetic properties of the device or system.

In exemplary embodiments, an electronic device comprises a heat source and a composite as disclosed herein positioned relative to the heat source for establishing a thermally conductive heat path from the heat source. The electronic device may further comprise a heat removal/dissipation structure, wherein the composite is between the heat source and the heat removal/dissipation structure. Additionally, or alternatively, the electronic device may comprise a board level shield, wherein the composite is between the heat source and the board level shield.

And the electronic device may comprise a heat removal/dissipation device and a thermal interface material between the board level shield and the heat removal/dissipation device. The heat source may comprise an integrated circuit. The heat removal/dissipation structure may comprise a heat sink. The thermal interface material may be disposed between the board level shield and the heat sink for establishing a thermally conductive heat path from the board level shield to the heat sink. And the thermally conductive EMI absorber may be disposed is between the integrated circuit and the board level shield for establishing a thermally conductive heat path from the integrated circuit to board level shield and for suppressing radiating electromagnetic fields coupling between the integrated circuit and the heat sink.

Various modifications and other embodiments of the invention described herein will be apparent to one skilled in the art in light of the teachings present in the foregoing description and the accompanying drawings. It is therefore to be understood that the present disclosure is not limited to the particular embodiments disclosed herein and any modifications and other embodiments are intended to be included within the scope of the appended claims.

What is claimed is:

1. A thermal interface material comprising a matrix material and a thermally conductive filler, wherein the thermally conductive filler has particles which are approximately spherical in shape when observed using a scanning electron microscope, an average particle diameter (D50) of 2μm-120μm, and an average degree of sphericity of 70%-90%, wherein the thermally conductive filler particles are configured to adsorb grease from the matrix material thereby reducing or preventing the occurrence of oil leakage from the thermal interface material, and wherein:

the thermally conductive filler is aluminum oxide;

the matrix material is an organic silicon resin;

the organic silicon resin is obtained by reacting a vinyl silicone oil with a hydrogen-containing silicone oil; and the thermal interface material is made using 15 parts of vinyl silicone oil, 5 parts of hydrogen-containing silicone oil, 79 parts of aluminum oxide, and 1 part of a titanate coupling agent, or the thermal interface material is made using 9 parts of vinyl silicone oil, 3 parts of hydrogen-containing silicone oil, 87 parts of aluminum oxide, and 1 part of a titanate coupling agent.

2. The thermal interface material of claim 1, wherein the thermally conductive filler has a specific surface area (SSA) of 0.01 $m^2$/g-1.3 $m^2$/g.

3. The thermal interface material of claim 1, wherein the thermally conductive filler is included in an amount of 85 wt %-96 wt % based on a total weight of the thermal interface material.

4. The thermal interface material of claim 1, wherein the matrix material is included in an amount of 3 wt %-25 wt % based on a total weight of the thermal interface material.

5. The thermal interface material of claim 1, wherein the thermal interface material is configured to have a thermal conductivity of 1.0 W/mK or more.

6. The thermal interface material of claim 1, wherein the thermal interface material further comprises one or more:

electrically conductive filler(s);

electromagnetic wave absorbing filler(s);

dielectric absorbing filler(s); and filler(s) that has two or more properties of being thermally conductive, electrically conductive, dielectric absorbing, and electromagnetic wave absorbing.

7. The thermal interface material of claim 1, wherein:

the thermally conductive filler has a specific surface area (SSA) of 0.01 $m^2/g$-1.3 $m^2/g$;

the thermally conductive filler is included in an amount of 85 wt %-96 wt % based on a total weight of the thermal interface material;

the matrix material is included in an amount of 3 wt %-25 wt % based on a total weight of the thermal interface material; and the thermal interface material has a thermal conductivity of 1.0 W/mK or more.

8. The thermal interface material of claim 1, wherein the thermal interface material is in the form of a thermally conductive gasket and/or a thermally conductive pad.

9. The thermal interface material of claim 1, wherein:

the thermally conductive filler particles have a quasi-spherical morphology with an increased surface area of the thermally conductive filler particles that enables the thermally conductive filler to adsorb grease from the matrix material of the composite thereby reducing or preventing the occurrence of oil leakage or migration from the composite;

the thermally conductive filler is included in an amount of 85 wt %-96 wt% based on a total weight of the composite such that the composite has a high thermal conductivity of 1.0 W/mK or more.

10. The thermal interface material of claim 1, wherein the thermally conductive filler have an average degree of sphericity of 75% to 90%.

11. The thermal interface material of claim 10, wherein the thermally conductive filler have an average degree of sphericity of 75% to 85%.

12. The thermal interface material of claim 1, wherein the thermally conductive filler have an average degree of sphericity of 70% or more and less than 85%.

13. The thermal interface material of claim 12, wherein the thermally conductive filler have an average degree of sphericity of 75%.

14. The thermal interface material of claim 12, wherein the thermally conductive filler have an average degree of sphericity of 83%.

15. The thermal interface material of claim 14, wherein the thermal interface material has a deformation at 20 psi of at least 25%.

16. The thermal interface material of claim 1, wherein the thermal interface material has a high flexibility with a deformation at 20 psi of 20% to 40%.

17. The thermal interface material of claim 1, wherein the thermally conductive filler adsorbs uncrosslinked silicone oil present in the matrix material such that adsorption of the uncrosslinked silicone oil reduces migration of grease from the thermal interface material.

18. The thermal interface material of claim 1, wherein the thermal interface material exhibits an oil bleeding rate of less than 20% as measured according to Oil Bleeding Test Method 1.

19. The thermal interface material of claim 18, wherein the oil bleeding rate is less than 12%.

20. The thermal interface material of claim 1, wherein the thermal interface material exhibits a weight loss rate of less than 1% according to Oil Bleeding Test Method 2.

21. A thermal interface material comprising a matrix material and a thermally conductive filler, wherein the thermally conductive filler has particles which are approximately spherical in shape when observed using a scanning electron microscope, an average particle diameter (D50) of 2 μm-120 μm, and an average degree of sphericity of 70%-90%, wherein the thermally conductive filler particles are configured to adsorb grease from the matrix material thereby reducing or preventing the occurrence of oil leakage from the thermal interface material, and wherein:

the thermally conductive filler particles comprise alumina having an average degree of sphericity of 90% and an average particle diameter (D50) of 50 μm;

the thermal interface material has a thermal conductivity of 1.41 W/mK;

the thermally conductive filler has a specific surface area (SSA) of 0.33 $m^2/g$; and the thermal interface material has a deformation at 20 psi of 29% and mixture viscosity of 292000 cps.

22. The thermal interface material of claim 21, wherein the matrix material is an organic silicon resin.

23. The thermal interface material of claim 21, wherein:

the thermally conductive filler is aluminum oxide;

the matrix material is an organic silicon resin;

the organic silicon resin is obtained by reacting a vinyl silicone oil with a hydrogen-containing silicone oil; and the thermal interface material is made using 15 parts of vinyl silicone oil, 5 parts of hydrogen-containing silicone oil, 79 parts of aluminum oxide, and 1 part of a titanate coupling agent, or the thermal interface material is made using 9 parts of vinyl silicone oil, 3 parts of hydrogen-containing silicone oil, 87 parts of aluminum oxide, and 1 part of a titanate coupling agent.

24. A thermal interface material comprising a matrix material and a thermally conductive filler, wherein the thermally conductive filler has particles which are approximately spherical in shape when observed using a scanning electron microscope, an average particle diameter (D50) of 2 μm-120 μm, and an average degree of sphericity of 70%-90%, wherein the thermally conductive filler particles are configured to adsorb grease from the matrix material thereby reducing or preventing the occurrence of oil leakage from the thermal interface material, and wherein:

the thermally conductive filler particles comprise alumina having an average degree of sphericity of 75% and an average particle diameter (D50) of 50 μm;

the thermal interface material has a thermal conductivity of 2.43 W/mK;

the thermally conductive filler has a specific surface area (SSA) of 0.21 $m^2/g$; and the thermal interface material has a deformation at 20 psi of 21% and mixture viscosity of 794000 cps.

25. A thermal interface material comprising a matrix material and a thermally conductive filler, wherein the thermally conductive filler has particles which are approximately spherical in shape when observed using a scanning electron microscope, an average particle diameter (D50) of 2 μm-120 μm, and an average degree of sphericity of 70%-90%, wherein the thermally conductive filler particles are configured to adsorb grease from the matrix material thereby reducing or preventing the occurrence of oil leakage from the thermal interface material, and wherein:

the thermally conductive filler particles comprise alumina having an average degree of sphericity of 83% and an average particle diameter (D50) of 50 μm;

the thermal interface material has a thermal conductivity of 2.37 W/mK;

the thermally conductive filler has a specific surface area (SSA) of 0.15 $m^2/g$; and the thermal interface material has a deformation at 20 psi of 31% and mixture viscosity of 453000 cps.

26. A method for preparing the thermal interface material of claim 1, the method comprising: evenly stirring and mixing organic silicon resin and the thermally conductive filler, then heating and curing the obtained mixture to obtain the thermal interface material with a certain thickness, wherein the thermally conductive filler has an average particle diameter (D50) of 2μm-120μm, and an average degree of sphericity of 70%-90%.

27. The method according to claim 26, wherein the organic silicon resin is obtained by reacting a vinyl silicone oil with a hydrogen-containing silicone oil.

* * * * *